United States Patent [19]

Noguchi

[11] Patent Number: 5,061,851
[45] Date of Patent: Oct. 29, 1991

[54] INSPECTION METHOD AND DEVICE FOR AN APERTURE IN A FOCUSED ION BEAM GENERATING APPARATUS

[75] Inventor: Shigeru Noguchi, Tokyo, Japan
[73] Assignee: Dai Nippon Insatsu Kabushiki Kaisha, Tokyo, Japan
[21] Appl. No.: 602,467
[22] Filed: Oct. 23, 1990

[30] Foreign Application Priority Data

Nov. 1, 1989 [JP] Japan .................................. 1-288092

[51] Int. Cl.⁵ .............................................. H01J 3/08
[52] U.S. Cl. .................................... 250/309; 250/397; 250/396 R
[58] Field of Search ............... 250/309, 307, 306, 397, 250/370, 396 R, 505.1

[56] References Cited

U.S. PATENT DOCUMENTS

| | | | |
|---|---|---|---|
| Re. 33,193 | 4/1990 | Yamaguchi et al. | 250/309 |
| 4,334,156 | 6/1982 | Bohlen et al. | 250/492.2 |
| 4,937,458 | 6/1990 | Fujikura | 250/397 |
| 4,939,371 | 7/1990 | Goto | 250/397 |

Primary Examiner—Jack I. Berman
Assistant Examiner—Kiet T. Nguyen
Attorney, Agent, or Firm—Ladas & Parry

[57] ABSTRACT

The apparatus comprising an ion source producing an ion beam, a limiting aperture plate having a limiting aperture through which the ion beam passes, a condensor lens making the ion beam parallel, monitoring electrodes generating an electric field which deflect the paralleled ion beam, a monitoring aperture plate having a monitoring aperture and an objective lens focusing the ion beam is inspected. A voltage is applied to the monitoring electrodes to deflect the ion beam and an electric current which flows in the monitoring aperture plate is detected. A diameter of the limiting aperture is determined based on a change of the electric current with respect to deflecting of the ion beam. On a surface of a sample, secondary charged particles are generated by collision of the ion beam. Intensity of the particles can be detected instead of detecting the electric current. A dimameter of the limiting aperture can also be determined based on a change of the intensity with respect to deflecting of the ion beam.

4 Claims, 4 Drawing Sheets

INSPECTION METHOD AND DEVICE FOR AN APERTURE IN A FOCUSED ION BEAM GENERATING APPARATUS

BACKGROUND OF THE INVENTION

This invention relates to an inspection method and device for an aperture in a focused ion beam generating apparatus and, more particularly, to a method and device for measuring a diameter of a limiting aperture which limit an ion beam passing therethrough.

A focused ion beam generating apparatus, which generates and irradiates an ion beam focused, is widely utilized in semiconductor lithographic processes such as drawing or modifying patterns on a semiconductor wafer or a photo mask. By scanning an ion beam, it is possible to produce an opaque material to modify a white defect, though it is also possible to remove an opaque material to modify a black defect. Nowadays it is required to control an focused ion beam with accuracy of an order of sub-microns in dimension in order to draw or modify a pattern on a photo mask applied to integrated circuits. Therefore the apparatus should be regularly inspected so as to operate with desired accuracy.

Accuracy in dimension of an ion beam mostly depends on dimension of a limiting aperture. The limiting aperture is formed on a limiting aperture plate which has a function to limit an ion beam passing therethrough within a desired diameter. Therefore, a peripheral part of the aperture on the plate always suffers from spattering with ion beam so that a diameter of the aperture becomes larger and larger as time passes. With the above described reason, it is very important to regularly inspect or measure a diameter of the limiting aperture and confirm that the measured diameter is in a proper range to ensure the operation of the apparatus with desired accuracy.

However, in a conventional inspection method for a limiting aperture, much labor is required. That is, an inspector has to remove the limiting aperture plate from the apparatus, measure a diameter of the aperture on the plate and assemble it into the apparatus again. Removing the aperture plate is not an efficient work for regular inspection.

SUMMARY OF THE INVENTION

Accordingly, it is an object of the invention to provide a novel method and a device for inspecting an aperture in a focused ion beam generating apparatus which an inspector easily carries out thus to improve efficiency in maintenance.

The first feature of the present invention resides in an inspection method and a device for an aperture in a focused ion beam generating apparatus, the apparatus comprising:

an ion source producing an ion beam;

a limiting aperture plate having a limiting aperture through which the ion beam passes, the aperture plate limiting a diameter of the ion beam;

a condensor lens for making the ion beam parallel;

monitoring electrodes for generating an electric field which deflect the paralleled ion beam;

a monitoring aperture plate having a monitoring aperture through which the deflected ion beam passes; and an objective lens for focusing the ion beam passed through the monitoring aperture;

wherein a voltage is applied to the monitoring electrodes to deflect the ion beam and an electric current which flows in the monitoring aperture plate is detected, thus to determine a diameter of the limiting aperture based on a change of the electric current with respect to deflecting of the ion beam.

In accordance with the first feature of the invention, an electric current which flows in the monitoring aperture plate is detected. When the ion beam passes through the center of the monitoring aperture, the detected current value equals zero in theory. On the other hand, when the ion beam is being deflected, a part of the beam comes to irradiate on a part of the monitoring aperture plate and an electric current begins to flow in the monitoring aperture plate. Thus, the detected current increases with increasing deflection. Finally, when whole the beam comes to irradiate on the plate, the detected current becomes the maximum and is saturated. Therefore a deflecting amount of the ion beam corresponding to a rising part of the detected current value indicates to a diameter of the ion beam, that is, a diameter of the limiting aperture. As described above, according to the first feature of the invention, it becomes very easy to inspect the limiting aperture by means of measuring an electric current flowing in the monitoring aperture plate.

The second feature of the present invention resides in an inspection method and a device for an aperture in a focused ion beam generating apparatus, the apparatus comprising:

an ion source producing an ion beam;

a limiting aperture plate having a limiting aperture through which the ion beam passes, the aperture plate limiting diameter of the ion beam;

a condensor lens for making the ion beam parallel;

monitoring electrodes for generating an electric field which deflect the paralleled ion beam;

a monitoring aperture plate having a monitoring aperture through which the deflected ion beam passes; and an objective lens for focusing the ion beam passed through the monitoring aperture;

wherein a voltage is applied to the monitoring electrodes to deflect the ion beam and an intensity of secondary charged particles generated by collision of the ion beam against a surface of a sample is detected, thus to determine a diameter of the limiting aperture based on a change of the intensity with respect to deflecting of the ion beam.

In accordance with the second feature of the invention, an intensity of secondary charged particles which generated from a sample is detected, instead of detecting an electric current as in the first feature. When the ion beam is being deflected, a part of the beam comes to irradiate on a part of the monitoring aperture plate and ions which reach the sample through the objective lens comes to decrease. Thus, the detected intensity decreases with increasing deflection. Finally, when whole the beam comes to irradiate on the plate or to be blocked by the plate, the detected intensity becomes zero. Therefore a deflecting amount of the ion beam corresponding to a dropping part of the detected intensity indicates a diameter of the ion beam, that is, a diameter of the limiting aperture. As described above, according to the second feature of the invention, it becomes very easy to inspect the limiting aperture by means of measuring an intensity of secondary charged particles generated on the surface of the sample.

DESCRIPTION OF THE PREFERRED EMBODIMENT

Figure 1:
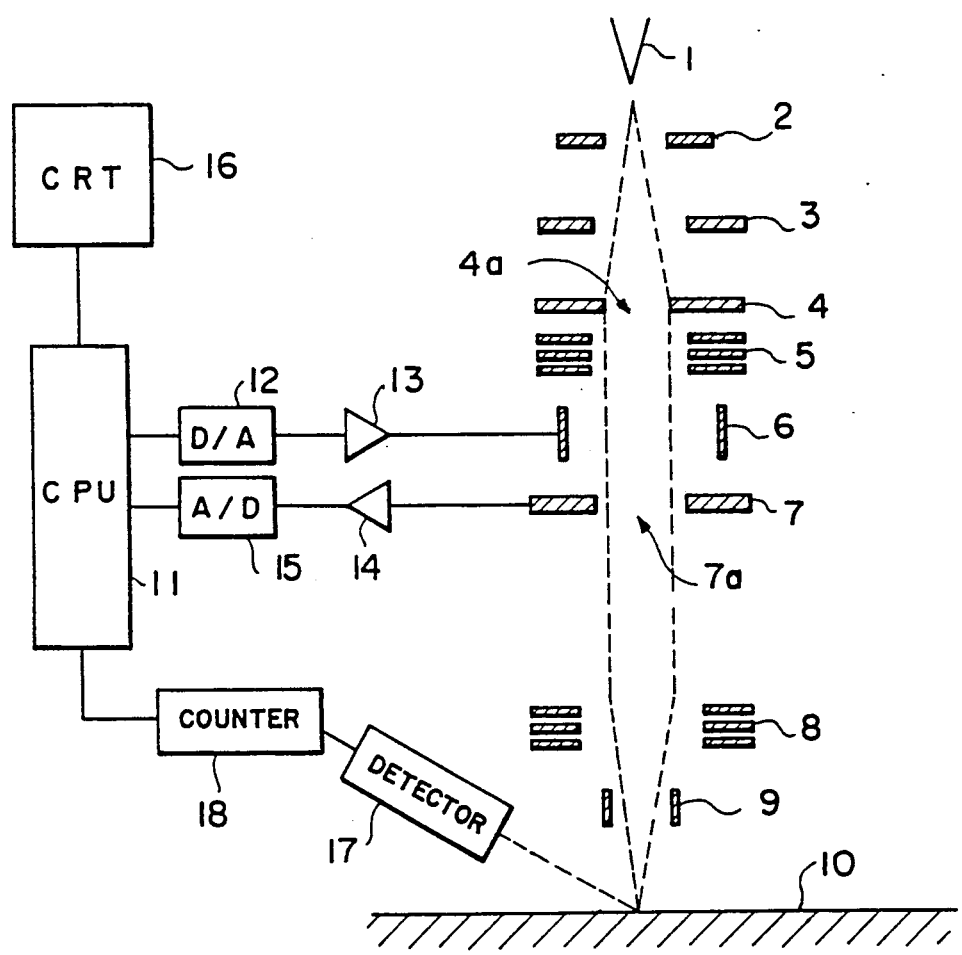
FIG. 1 is an elevational view in section showing a basic structure for inspecting a limiting aperture according to the present invention.

Referring to the drawings, preferred embodiments of the present invention will be described in detail.

<STRUCTURE OF A FOCUSED ION BEAM GENERATING APPARATUS>

Figure 2:
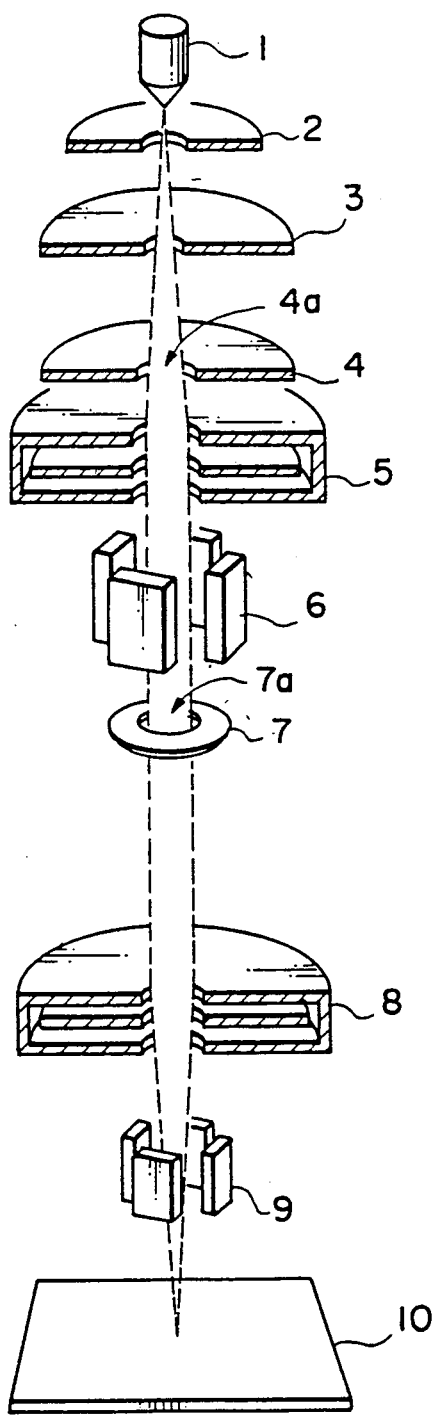
FIG. 2 is a perspective illustration of a focused ion beam generating apparatus partially shown in sectional view.

FIG. 1 is an elevational view in section showing a basic structure for inspecting a limiting aperture. The parts shown in the right half in FIG. 1 are fundamental elements constituting a focused ion beam generating apparatus. The perspective view of the apparatus is shown in FIG. 2 where some of the parts are shown in section. In FIGS. 1 and 2, broken lines indicate a path of an ion beam.

First, general structure of a focused ion beam generating apparatus will be explained referring to FIG. 2 and the right half of FIG. 1. An ion source 1 generates ions which are extracted by an extracting electrode 2 in the lower direction in the figure so as to form an ion beam. Then the ion beam is accelerated by an accelerating electrode 3. Both of the extracting electrode 2 and the accelerating electrode 3 are biased to a predetermined voltage, respectively. The accelerated ion beam passes through a limiting aperture 4a formed at a center on a limiting aperture plate 4. A diameter of the ion beam which has passed through the limiting aperture 4a is determined by a diameter of the limiting aperture 4a. A condenser lens 5 makes the ion beam a parallel beam which passes a space formed between pairs of monitoring electrodes 6 and a monitoring aperture 7a formed on a monitoring aperture plate 7. The ion beam which has passed the monitoring aperture 7a is focused by an objective lens 8 and deflected by a deflecting electrodes 9 thus to irradiate a sample 10.

The monitoring electrodes 6 has a function of collimating. That is, it is possible to produce an electric field to adjust an optical axis of the ion beam to a proper position by applying voltages to the electrodes 6. The monitoring apperture plate 7 has a function to confirm that the proper centering of the beam is made. That is, it is possible to obtain information concerning with a position of the optical axis of the passing ion beam by observing an electric current in the plate 7. The deflecting electrodes 9 has a function to deflect the ion beam to scan. That is, it is possible to two dimensionally scan the focused ion beam on a surface of the sample 10 by applying voltages to the electrodes 9.

It is to be noticed that the above described parts are only fundamental parts constituting a general focused ion beam generating apparatus and there may be other various parts in a practical apparatus.

The feature of the present invention is to provide a method and a device for measuring a diameter of the limiting aperture 4a on the limiting aperture plate 4 in the above described apparatus. In the specification two preferred embodiments will be explained as follows.

<THE FIRST EMBODIMENT>

The embodiment described below corresponds to the first feature of the present invention where an electric current in the monitoring aperture plate 7 is detected to measure a diameter of the limiting aperture 4a. There is provided a CPU 11, as shown in FIG. 1, to control the inspecting procedure. To the CPU 11, a D/A converter 12 is connected. The CPU 11 outputs a digital data to the D/A converter 12 and the converter 12 outputs an analog voltage signal corresponding to the inputted digital data. The voltage signal is amplituded in an amplifier 13 and then is applied to the monitoring electrodes 6. Therefore, the CPU 11 can control deflecting the ion beam by controlling voltage applied to the monitoring electrodes 6.

On the other hand, a wire is connected to a part of the monitoring aperture plate 7 at one end and the other end of the wire is connected to an amplifier 14. An output of the amplifier 14 is connected to the CPU 11 through an A/D converter 15. When the ion beam irradiates the monitoring aperture plate 7, an electrical current (which will be called aperture current hereinafter) is generated in the plate 7 which flows on the wire into the amplifier 14 and amplituded there. The amplituded aperture current value is converted to a digital data in the A/D converter 15 and inputted to the CPU 11. There is also provided a CRT 16 which is connected to the CPU 11. The results of the measurement will be displayed in the CRT 16. A detector 17 and a counter 18, which will be explained in the description for the next embodiment, are not used in this embodiment.

Figure 3:
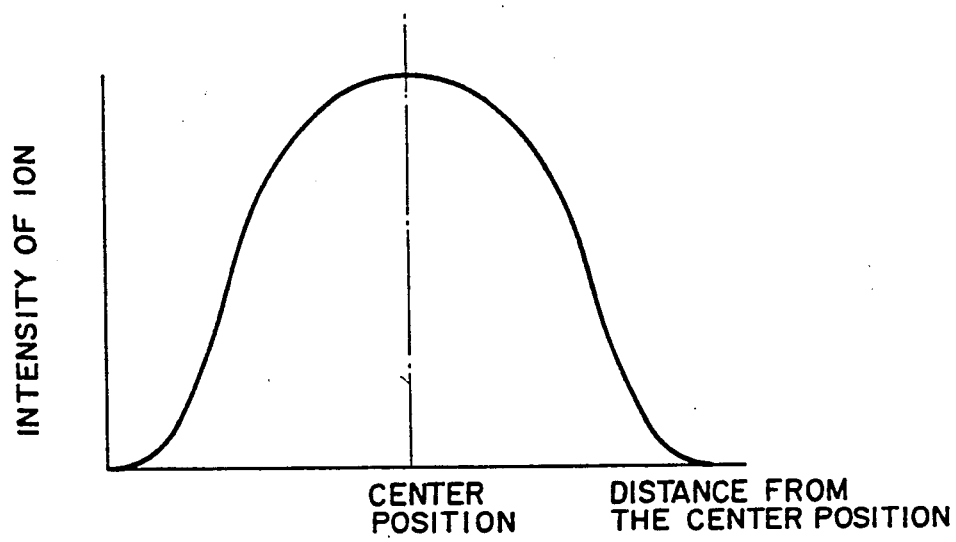
FIG. 3 is a graph showing ion distribution in a cross section of a general ion beam.

The basic measuring principle in this embodiment will be explained by referring to drawings. FIG. 3 is a graph showing ion distribution in a cross section of a general ion beam, where the horizontal axis indicates a distance from the center position on the cross section of the ion beam and the vertical axis indicates intensity of the ion. As illustrated in the graph, on the cross section of the ion beam, a Gaussian distribution is generally found in which the intensity of ion takes a peak at a center position and gradually reduces with increasing distance from the center position.

Figure 4:
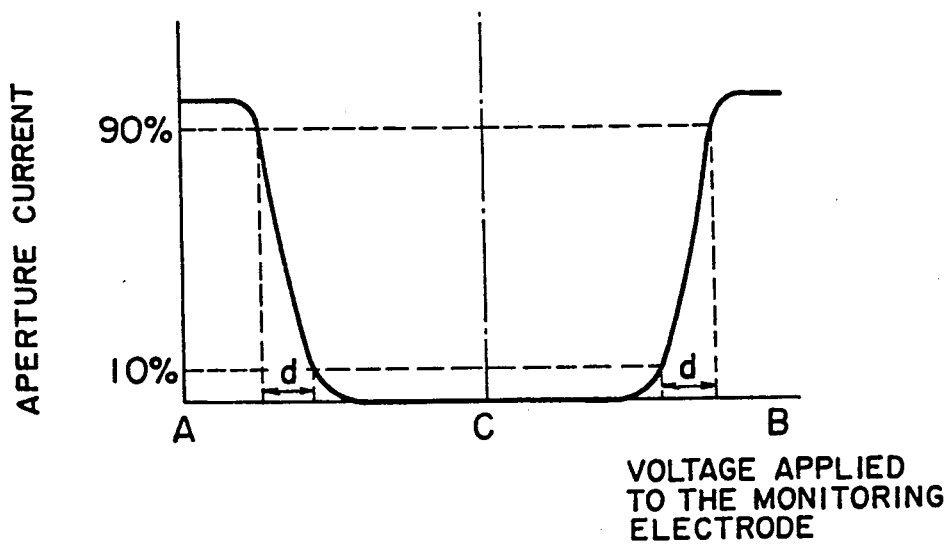
FIG. 4 is a graph explaining a fundamental principle of the first feature of the present invention.

When the applied voltage to the monitoring electrodes 6 is gradually varied to deflect the ion beam, an aperture current observed in the monitoring aperture plate 7 varies as shown in the graph of FIG. 4, where the horizontal axis indicates a voltage applied to the monitoring electrodes 6 and the vertical axis indicates the aperture current. The voltage value C on the horizontal axis indicates a voltage applied to the monitoring electrodes 6 when the ion beam is adjusted to pass though the center of the monitoring aperture 7a. It is to be understood that when the voltage applied to the monitoring electrodes 6 gradually increases from the voltage value C to deflect the ion beam from its center position, a part of the beam comes to irradiate the monitoring aperture plate 7 and an aperture current comes to appear. When the voltage further increases to deflect the ion beam more, the energy of irradiating ion beam on the plate 7 increases so that the aperture current further increases. At last, when the whole ion beam comes to irradiate the plate 7, the aperture current takes a maximum value and is saturated. The same type of curve for aperture current is obtained when the voltage gradually decreases from the voltage value C. Therefore, it is understood that a deflecting amount from a position where the aperture current starts to flow to a position where the aperture current just has reached the saturated maximum value corresponds to a diameter of the ion beam. In other words, the width in horizontal direction of the rising part of the graph shown in FIG. 4 corresponds to a diameter of the ion beam. Since the intensity of ion gradually decreases in a peripheral part on the cross section of the beam as shown in the distribution in FIG. 3, the graph of the aperture current in FIG. 4 is not steep but gentle. Therefore, in this embodiment, width d as shown in FIG. 4 is detected as a measured value for a diameter of the ion beam, where the width d is a width of the rising part which locates from a current value of 10% to 90% regarding the saturated maximum value of the current as 100%. The detected width d indicates a diameter of the limiting aperture 4a, because the diameter of the ion beam is determined by the diameter of the limiting aperture 4a. As shown in FIG. 4, the width d is detected as a voltage value and it does not indicate an absolute value for the diameter. However, the measurement for the absolute value is not required, as the object of the measurement in the embodiment is for the sake of maintenance. It is enough to know dimensional changes in the diameter caused by aging for the sake of maintenance. Therefore, there is no problem to regard the detected voltage value d as the diameter of the limiting aperture 4a.

The CPU 11 automatically carries out a detecting procedure based on the principle described above to measure a diameter of the limiting aperture 4a. That is, the CPU 11 gives an instruction to the D/A converter 12 to gradually change an output voltage. At the same time, the CPU 11 receives aperture current values from the A/D converter 15 at each time when respective voltages are applied to the monitoring electrodes 6 thus to make a graph as shown in FIG. 4 on a memory. In practical, it is preferable to gradually increase a voltage, which is applied to the monitoring electrodes 6, from a value A to B shown in FIG. 4 and to continuously input aperture current values to make a graph. The width d corresponding to the range of 10% to 90% can be calculated based on the obtained graph such as a graph shown in FIG. 4 and the calculated value is displayed on the CRT 16. The only effort which an inspector should make is to give an order for starting inspection to CPU 11. The limiting aperture plate 4 is not required to be removed from the apparatus as it was in the inspection.

<THE SECOND EMBODIMENT>

Now the second embodiment of the invention will be described. The measuring principle in the second embodiment is mostly the same as that in the above described first embodiment. The difference is that an intensity of secondary charged particles is detected instead of an aperture current. For this detection, there are provided a detecter 17 for detecting secondary electrons generated on the surface of the sample 10 and a counter 18 for counting the detected electrons. The detected intensity of secondary electrons is inputted to the CPU 11. The detecter 17 may detect secondary ions or total ions (both of reflected primary ions and secondary ions) instead of secondary electrons. In this specification, the general term "secondary charged particles" is used which includes secondary electrons, secondary ions, and reflected primary ions.

Figure 5:
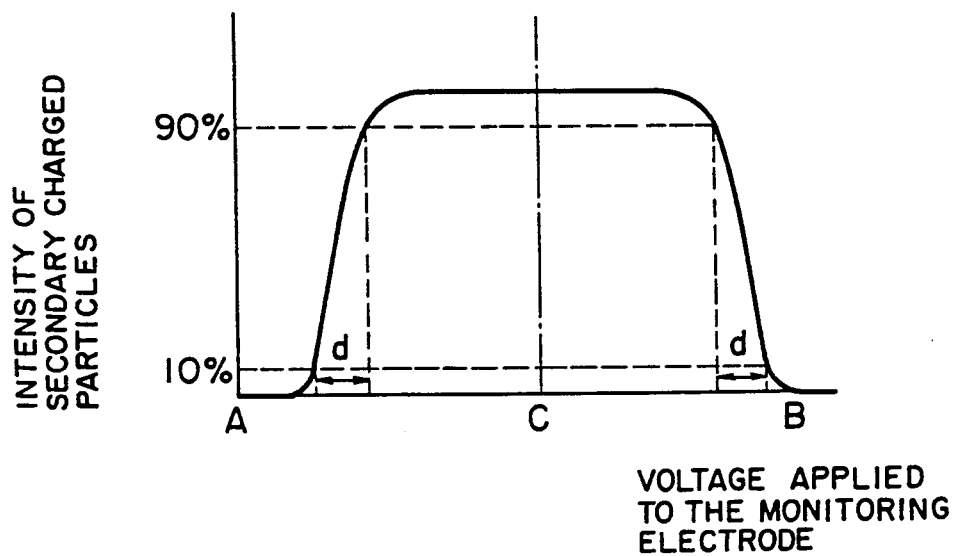
FIG. 5 is a graph explaining a fundamental principle of the second feature of the present invention.

In the above described inspection system, when an applied voltage to the monitoring electrodes 6 gradually increases to deflect the ion beam, the intensity of secondary charged particles changes as shown in the graph of FIG. 5, where the horizontal axis indicates a voltage applied to the monitoring electrodes 6 and the vertical axis indicates an intensity of secondary charged particles. Gradually increasing (or decreasing) the voltage from the voltage value C toward B (or A), the ion beam is gradually deflecting and a part of the ion beam comes to irradiate the monitoring aperture plate 7. From a point of view on the sample 10, the ion beam comes to be screened or blocked by the monitoring aperture plate 7 so that the amount of ions which reach the sample 10 gradually decreases with increasing (or decreasing) voltage. This decreases the intensity of secondary charged particles. At last, when whole the ion beam is screened or blocked by the monitoring aperture plate 7, there is no secondary charged particles observed in theory. Therefore, it is understood that a deflecting amount from a position where the intensity starts to drop from the maximum value to a position where the intensity becomes zero corresponds to a diameter of the ion beam. In other words, the width in horizontal direction of the dropping part of the graph shown in FIG. 5 corresponds to a diameter of the ion beam, where the width d is a width of the dropping part which locates from a intensity value of 90% to 10% regarding the maximum value of the intensity as 100%. The width d is regarded as a value indicating a diameter of the ion beam to be detected in this second embodiment too.

The CPU 11 automatically carries out a detecting procedure based on the principle described above to measure a diameter of the limiting aperture. That is, the CPU 11 gives an instruction to the D/A converter 12 to gradually change an output voltage. At the same time, the CPU 11 receives detected intensity values from the counter 18 at each time when respective voltages are applied to the monitoring electrodes 6 thus to make a graph as shown in FIG. 5 on a memory. In practical, it is preferrable to gradually increase a voltage, which is applied to the monitoring electrodes 6, from a value A to B shown in FIG. 5 and to continuously input intensity values to make a graph. The width d corresponding to the range of 90% to 10% can be calculated based on the obtained graph such as a graph shown in FIG. 5 and the calculated value is displayed on the CRT 16.

Having described the present invention as related to the two embodiments, it is to be noticed that the invention is not limited by any of the details of the embodiments. Modification and variation of the invention is possible in light of the above teachings. For example, in the embodiments, the ion beam is deflected in one direction. However, it is possible to deflect the ion beam in various directions and obtain a contour line of limiting aperture. Further, the present invention can be applied not only to the ion beam generating apparatus, but also to the electron beam generating apparatus.

What is claimed is:

1. An inspection method for an aperture in a focused ion beam generating apparatus, said apparatus comprising:

an ion source producing an ion beam;

a limiting aperture plate having a limiting aperture through which said ion beam passes, said limiting aperture plate limiting a diameter of said ion beam;

a condensor lens for making said ion beam parallel;

monitoring electrodes for generating an electric field which deflect said paralleled ion beam;

a monitoring aperture plate having a monitoring aperture through which said deflected ion beam passes; and an objective lens for focusing said ion beam passed through said monitoring aperture;

said method comprising steps of:

applying a voltage to said monitoring electrodes to deflect said ion beam;

detecting an electric current which flows in said monitoring aperture plate; and determining a diameter of said limiting aperture based on a change of said electric current with respect to deflecting of the ion beam.

2. An inspection method for an aperture in a focused ion beam generating apparatus, said apparatus comprising:

an ion source producing an ion beam;

a limiting aperture plate having a limiting aperture through which said ion beam passes, said limiting aperture plate limiting a diameter of said ion beam;

a condensor lens for making said ion beam parallel;

monitoring electrodes for generating an electric field which deflect said paralleled ion beam;

a monitoring aperture plate having a monitoring aperture through which said deflected ion beam passes; and an objective lens for focusing said ion beam passed through said monitoring aperture;

said method comprising steps of:

applying a voltage to said monitoring electrodes to deflect said ion beam;

detecting an intensity of secondary charged particles generated by collision of said ion beam against a surface of a sample; and determining a diameter of said limiting aperture based on a change of said intensity with respect to deflecting of the ion beam.

3. An inspection device for an aperture in a focused ion beam generating apparatus, said apparatus comprising:

an ion source producing an ion beam;

a limiting aperture plate having a limiting aperture through which said ion beam passes, said limiting aperture plate limiting a diameter of said ion beam;

a condensor lens for making said ion beam parallel;

monitoring electrodes for generating an electric field which deflect said paralleled ion beam;

a monitoring aperture plate having a monitoring aperture through which said deflected ion beam passes; and an objective lens for focusing said ion beam passed through said monitoring aperture;

said device comprising:

voltage applying means for applying a voltage to said monitoring electrodes to deflect said ion beam;

current detecting means for detecting an electric current which flows in said monitoring aperture plate; and means for controlling said voltage applying means to change said applying voltage, inputting a detected value of said current detecting means during said applying voltage changing, calculating a width of change in said applying voltage corresponding to a section where said detected value changes in a predetermined range and outputting said width regarding it as a value indicating a diameter of said limiting aperture.

4. An inspection device for an aperture in a focused ion beam generating apparatus, said apparatus comprising:

an ion source producing an ion beam;

a limiting aperture plate having a limiting aperture through which said ion beam passes, said limiting aperture plate limiting a diameter of said ion beam;

a condensor lens for making said ion beam parallel;

monitoring electrodes for generating an electric field which deflect said paralleled ion beam;

a monitoring aperture plate having a monitoring aperture through which said deflected ion beam passes; and an objective lens for focusing said ion beam passed through said monitoring aperture;

said device comprising:

voltage applying means for applying a voltage to said monitoring electrodes to deflect said ion beam;

detecting means for detecting an intensity of secondary charged particles generated by collision of said ion beam against a surface of a sample; and means for controlling said voltage applying means to change said applying voltage, inputting a detected value of said detecting means during said applying voltage changing, calculating a width of change in said applying voltage corresponding to a section where said detected value changes in a predetermined range, and outputting said width regarding it as a value indicating a diameter of said limiting aperture.

* * * * *